United States Patent
Tanioku

(10) Patent No.: US 7,763,953 B2
(45) Date of Patent: Jul. 27, 2010

(54) SEMICONDUCTOR DEVICE AND METHOD OF MANUFACTURING THE SAME

(75) Inventor: Masami Tanioku, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 162 days.

(21) Appl. No.: 12/073,333

(22) Filed: Mar. 4, 2008

(65) Prior Publication Data

US 2008/0224263 A1    Sep. 18, 2008

(30) Foreign Application Priority Data

Mar. 14, 2007    (JP) ............... 2007-064323

(51) Int. Cl.
    *H01L 27/108* (2006.01)
(52) U.S. Cl. .............. 257/532; 257/312; 257/516
(58) Field of Classification Search .......... 257/532, 257/E21.09, E27.092, 68, 71, 296, 301, 303, 257/306
    See application file for complete search history.

(56) References Cited

U.S. PATENT DOCUMENTS

| 6,495,878 | B1 * | 12/2002 | Hayashi et al. ............. 257/310 |
| 6,660,660 | B2 * | 12/2003 | Haukka et al. ............. 438/778 |
| 7,038,284 | B2 * | 5/2006 | Haukka et al. ............. 257/411 |
| 2004/0227278 | A1 | 11/2004 | Kijima et al. | |

FOREIGN PATENT DOCUMENTS

| JP | 3-252162 | | 11/1991 |
| JP | 9-260516 | | 10/1997 |
| JP | 2000-208743 | | 7/2000 |
| JP | 2004-273808 | | 9/2004 |
| JP | 2005-217409 | | 8/2005 |
| KR | 2006075999 | A  * | 7/2006 |

OTHER PUBLICATIONS

Japnese Office Action dated Apr. 15, 2009 with partial English-language translation.

* cited by examiner

*Primary Examiner*—Leonardo Andújar
*Assistant Examiner*—Jordan Klein
(74) *Attorney, Agent, or Firm*—McGinn IP Law Group, PLLC

(57) ABSTRACT

A semiconductor device including a capacitor which includes a first electrode, a second electrode, and a dielectric layer disposed between the first electrode and the second electrode, the dielectric layer including: a first paraelectric film formed of a material containing a first metal element and at least one kind of second metal element; a second paraelectric film disposed between the first electrode and the first paraelectric film; and a third paraelectric film disposed between the second electrode and the first paraelectric film, wherein the second paraelectric film is formed of a material containing the first metal element but substantially not containing the second metal element, and the third paraelectric film is formed of a material containing the first metal element but substantially not containing the second metal element.

7 Claims, 4 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and, more particularly, to a semiconductor device provided with a capacitor formed by holding a paraelectric film between electrodes and to a method of manufacturing the semiconductor device.

2. Description of the Related Art

In semiconductor devices, including a dynamic random access memory (DRAM), elements are required to be integrated at a high density. As a result, a capacitor composing a memory cell is also required to be downsized. Capacitors of a conventional DRAM are formed by, for example, holding a dielectric film, such as a silicon nitride (SiN) film or a tantalum oxide (TaO) film, between conductor films, such as titanium nitride (TiN) films.

The capacitance of a capacitor have to be maintained while downsizing the capacitor. However, simply thin-filming the dielectric film in an attempt to maintain the capacitance of the capacitor causes the leakage current thereof to increase. Even in a case where an LTO (La-doped Ti oxide) film, the leakage current of which is smaller than that of a titanium oxide (Ti oxide) film, is used for the dielectric film, the leakage current increases drastically if the dielectric film is thinned to approximately 10 nm. Thickening the dielectric film in an attempt to prevent the increase of the leakage current results in the problem that the capacitor capacitance decreases. Accordingly, there is a need for a capacitor capable of minimizing a leakage current with an amount of capacitance change smaller than ever before.

Japanese Patent Laid-Open No. 9-260516 describes a capacitor structure element having a laminated structure composed of a lower electrode, a buffer layer (titanium oxide layer), a ferroelectric film ($Bi_4Ti_3O_{12}$ film), an overcoat layer (titanium oxide layer) and an upper electrode, indicating that the capacitor structure element is applicable to ferroelectric memory devices. The publication also describes that forming the overcoat layer improves a leakage current characteristic and forming the buffer layer improves the symmetry of a hysteresis loop. However, techniques concerning this capacitor structure element are directed to solving problems specific to the use of a ferroelectric film.

SUMMARY OF THE INVENTION

An object of the present invention is to provide a semiconductor device having a capacitor structure capable of minimizing a leakage current with an amount of capacitance change smaller than ever before in a capacitor formed by using paraelectric films, and a method of manufacturing the semiconductor device.

According to one aspect of the present invention, there is provided a semiconductor device comprising a capacitor which includes a first electrode, a second electrode, and a dielectric layer disposed between the first electrode and the second electrode, the dielectric layer comprising:

a first paraelectric film formed of a material containing a first metal element and at least one kind of second metal element;

a second paraelectric film disposed between the first electrode and the first paraelectric film; and a third paraelectric film disposed between the second electrode and the first paraelectric film;

wherein the second paraelectric film is formed of a material containing the first metal element but substantially not containing the second metal element, and the third paraelectric film is formed of a material containing the first metal element but substantially not containing the second metal element.

According to another aspect of the present invention, there is provided the above-described semiconductor device wherein the capacitor comprises a plurality of the first paraelectric films, and a fourth paraelectric film disposed between each pair of the first paraelectric films, and the fourth paraelectric film is formed of a material containing the first metal element but substantially not containing the second metal element.

According to another aspect of the present invention, there is provided either one of the above-described semiconductor devices wherein the first metal element is titanium (Ti).

According to yet another aspect of the present invention, there is provided any one of the above-described semiconductor devices wherein the second metal element is selected from the group consisting of hafnium (Hf), aluminum (Al), yttrium (Y) and lanthanum (La).

According to still another aspect of the present invention, there is provided any one of the above-described semiconductor devices wherein the first metal element is titanium (Ti) and the second metal element is selected from the group consisting of hafnium (Hf), aluminum (Al), yttrium (Y) and lanthanum (La).

According to still another aspect of the present invention, there is provided any one of the above-described semiconductor devices wherein the second paraelectric film and the third paraelectric film have dielectric constants larger than the dielectric constant of the first paraelectric film.

According to still another aspect of the present invention, there is provided any one of the above-described semiconductor devices wherein the second paraelectric film, the third paraelectric film and the fourth paraelectric film have dielectric constants larger than the dielectric constant of the first paraelectric film.

According to still another aspect of the present invention, there is provided a method of manufacturing a semiconductor device which includes a capacitor, comprising:

forming a first electrode;

forming a dielectric layer on the first electrode; and forming a second electrode on the dielectric layer, wherein the forming of the dielectric layer comprises:

forming a first paraelectric film on the first electrode using a material containing the first metal element;

forming at least one layer of a second paraelectric film on the first paraelectric film using a material containing the first metal element and a second metal element virtually not contained in the first paraelectric film; and forming a third paraelectric film using a material containing the first metal element but substantially not containing the second metal element after forming the second paraelectric film; and wherein the second electrode is formed on the uppermost third paraelectric film in the forming of the second electrode.

According to still another aspect of the present invention, there is provided the above-described method of manufacturing a semiconductor device, wherein, in the forming of the dielectric layer, a plurality of the second paraelectric films are formed, and a fourth paraelectric film is formed between each pair of the second paraelectric films, the fourth paraelectric film being formed of a material containing the first metal element but substantially not containing the second metal element.

According to still another aspect of the present invention, there is provided either one of the above-described methods of manufacturing a semiconductor device, wherein the first metal element is titanium (Ti) and the second metal element is selected from the group consisting of hafnium (Hf), aluminum (Al), yttrium (Y) and lanthanum (La).

According to still another aspect of the present invention, there is provided any one of the above-described methods of manufacturing a semiconductor device, wherein the first paraelectric film and the third paraelectric film have dielectric constants larger than the dielectric constant of the second paraelectric film.

According to the present invention, in a semiconductor device provided with a capacitor formed using paraelectric films, it is possible to minimize a leakage current with an amount of capacitance change smaller than ever before. Specifically, it is possible to provide a semiconductor device including a miniaturized capacitor wherein a sufficient capacitance is secured while suppressing a leakage current.

DETAILED DESCRIPTION OF THE PREFERRED EMBODIMENTS

Figure 1:
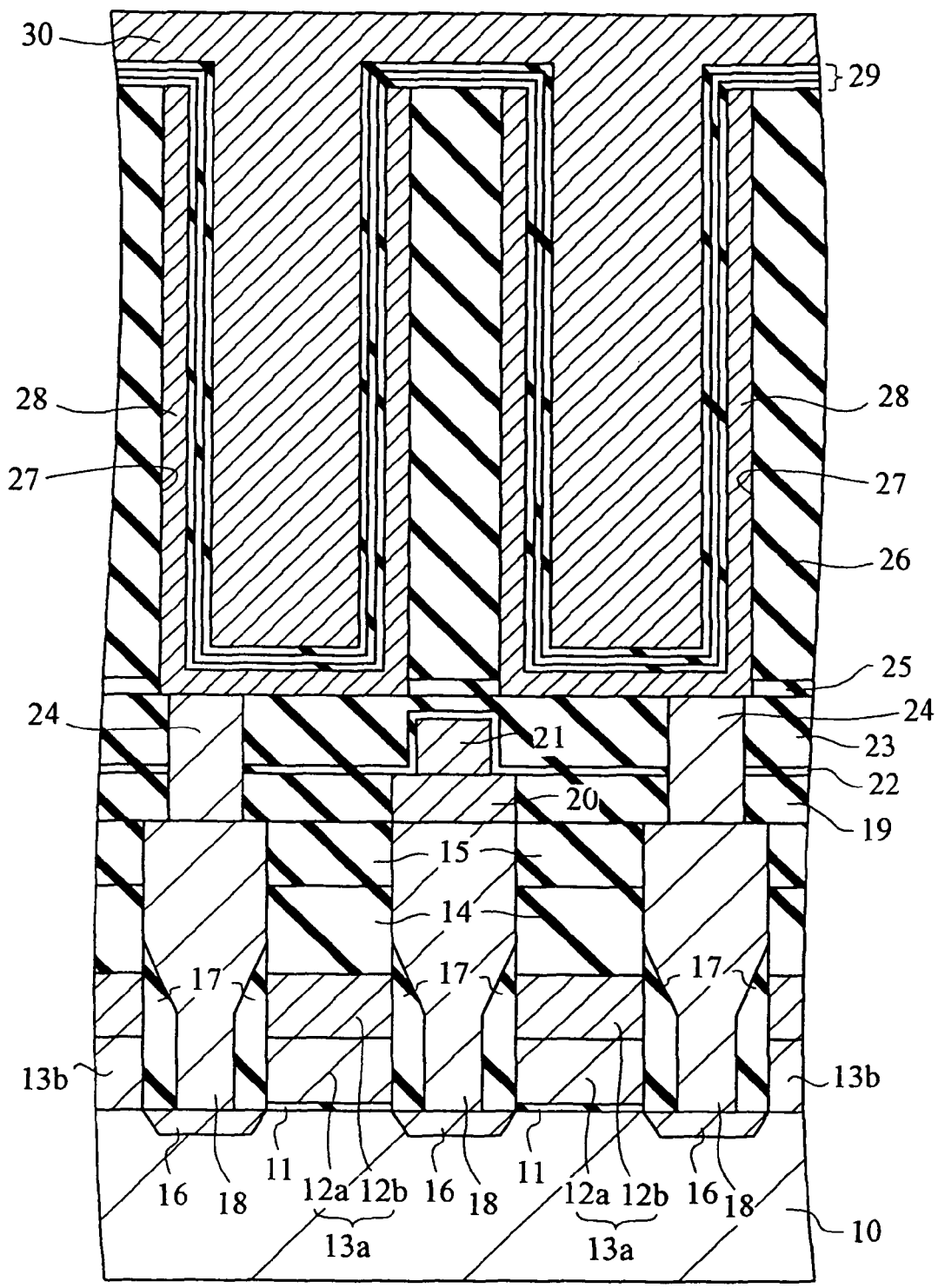
FIG. 1 is a cross-sectional view of the relevant part of a semiconductor memory device in accordance with one exemplary embodiment of the present invention.

FIG. 1 is a cross-sectional view of the relevant part of a memory cell of a DRAM in accordance with the present exemplary embodiment. The DRAM of the present exemplary embodiment is formed on a semiconductor substrate wherein a plurality of active regions are divided off by element-isolating films formed of an insulating material, though not shown in the figure.

As shown in FIG. 1, the DRAM of the present exemplary embodiment includes two gate insulating films 11 crossing over the respective active regions of a silicon substrate 10. On each gate insulating film 11, there is formed a gate electrode 13a laminated with a polysilicon layer 12a and a tungsten layer 12b. The two gate electrodes 13a form part of word lines provided in parallel so as to linearly extend over the silicon substrate 10 across the plurality of active regions. In addition, dummy gate electrodes 13b are formed so as to sandwich the two gate electrode 13a.

A cap insulating layer 14 formed of silicon nitride (SiN) and a first interlayer insulating film 15 formed of oxide silicon (SiO) are laminated on each gate electrode 13a. A diffused layer 16 serving as a source/drain region is formed on the surface of each part of the silicon substrate 10 positioned between the gate electrodes 13a and between each gate electrode 13a and each dummy gate electrode 13b. Both side surfaces of each gate electrode 13a and both side surfaces of each dummy gate electrode 13b are covered with sidewalls 17 formed of silicon nitride. A cell contact plug 18 formed of polysilicon (poly-Si) is disposed above each active region sandwiched between the sidewalls 17, so as to penetrate from the surface of the diffused layer 16 to the upper surface of the first interlayer insulating film 15.

A second interlayer insulating film 19 formed of silicon oxide is laminated on the first interlayer insulating film 15. A bit line contact plug 20 formed of tungsten (W) is disposed on the middle cell contact plug 18 formed between the gate electrodes 13a, so as to penetrate the second interlayer insulating film 19. A bit line 21 formed of tungsten is disposed on the bit line contact plug 20. A first silicon nitride film 22 is laminated so as to cover the second interlayer insulating film 19 and the bit line 21. A third interlayer insulating film 23 formed of oxide silicon is laminated on the first silicon nitride film 22. Capacitance contact plugs 24 formed of polysilicon are disposed on the two cell contact plugs 18 respectively formed between each gate electrode 13a and each dummy gate electrode 13b, so as to penetrate the second interlayer insulating film 19, the first silicon nitride film 22, and the third interlayer insulating film 23.

A second silicon nitride film 25 and a fourth interlayer insulating film 26 are sequentially laminated on the third interlayer insulating film 23. A hole 27 is disposed on each capacitance contact plug 24, so as to penetrate the second silicon nitride film 25 and the fourth interlayer insulating film. The inner diameter of the hole 27 of the present exemplary embodiment is approximately 100 nm. The inner wall of each hole 27 is covered with a lower electrode 28 made of platinum (Pt). In addition, a dielectric film 29 made of a paraelectric material is formed so as to cover at least the surface of the lower electrode 28 within the hole 27. The paraelectric material is a material having no hysteresis. The thickness of the entire dielectric film 29 of the present exemplary embodiment is approximately 10 nm, which is sufficiently smaller than the inner diameter of the hole 27. An upper electrode 30 made of platinum (Pt) is formed on the dielectric film 29 so as to completely fill the hole 27. Various material layers necessary to form a DRAM are disposed on the upper electrode 30, as appropriate. A barrier layer such as TiN layer may be formed between the capacitance contact plug 24 and the lower electrode 28.

Note that the lower electrode 28 and the upper electrode 30 are preferably formed of a material selected from the group consisting of ruthenium (Ru), iridium (Ir), platinum (Pt), titanium nitride (TiN) and tungsten nitride (WN).

Figure 2:
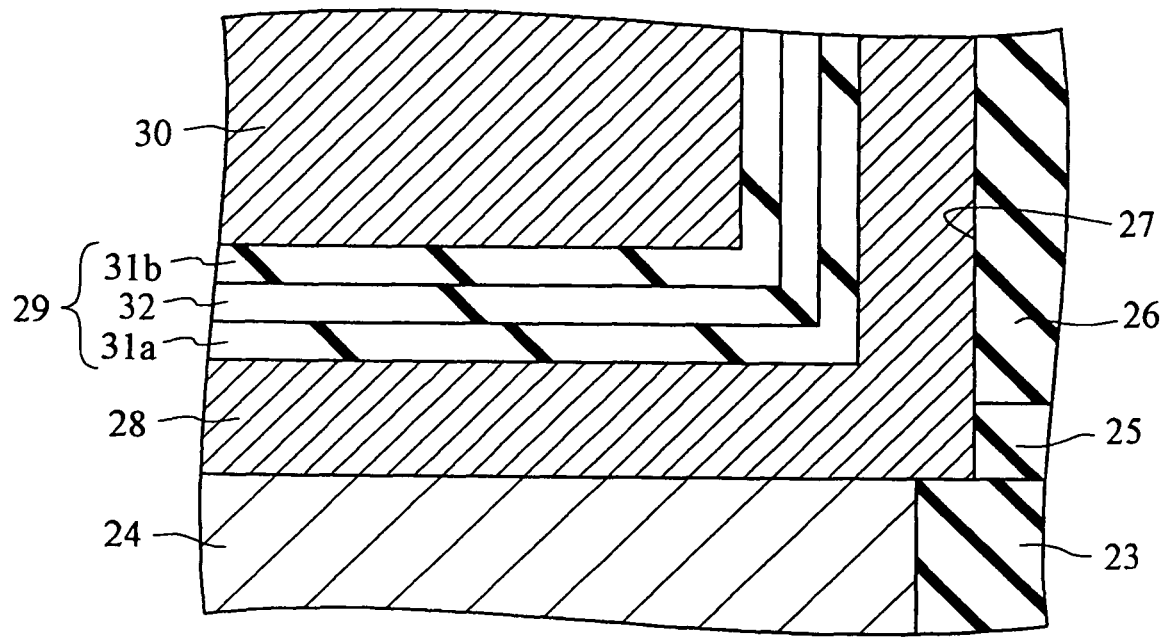
FIG. 2 is a partially enlarged view of a capacitor of the semiconductor memory device shown in FIG. 1.

FIG. 2 is a partially enlarged view of a vicinity of the dielectric film 29 of the DRAM in accordance with the present exemplary embodiment. As shown in FIG. 2, the dielectric film 29 is formed of a first titanium oxide film 31a, a titanium oxide-based dielectric film 32 and a second titanium oxide film 31b.

The first titanium oxide film 31a is formed of titanium oxide (Ti oxide) and is disposed between the lower electrode 28 and the titanium oxide-based dielectric film 32. The titanium oxide of the present exemplary embodiment is amorphous. Alternatively, the titanium oxide may be crystalloid or of another form. The second titanium oxide film 31b is formed of titanium oxide, as with the first titanium oxide film 31a, and is disposed between the upper electrode 30 and the titanium oxide-based dielectric film 32.

The titanium oxide-based dielectric film 32 is formed of LTO (La-doped Ti oxide) containing lanthanum (La), which is not contained in either the first titanium oxide film 31a or the second titanium oxide film 31b, in addition to titanium (Ti) contained in the first and second titanium oxide films 31a and 31b. The titanium oxide-based dielectric film 32 is held between the first and second titanium oxide films 31a and 31b, so as not to come into contact with the lower electrode 28 and the upper electrode 30. The titanium oxide has a dielectric constant larger than that of the LTO.

Note that the titanium oxide-based dielectric film 32 preferably contains at least one element selected from the group consisting of hafnium (Hf), aluminum (Al), lanthanum (La) and yttrium (Y) which are not contained in the first and second titanium oxide films 31a and 31b, in addition to the titanium (Ti) element contained in the first and second titanium oxide films 31a and 31b.

Figure 3A:
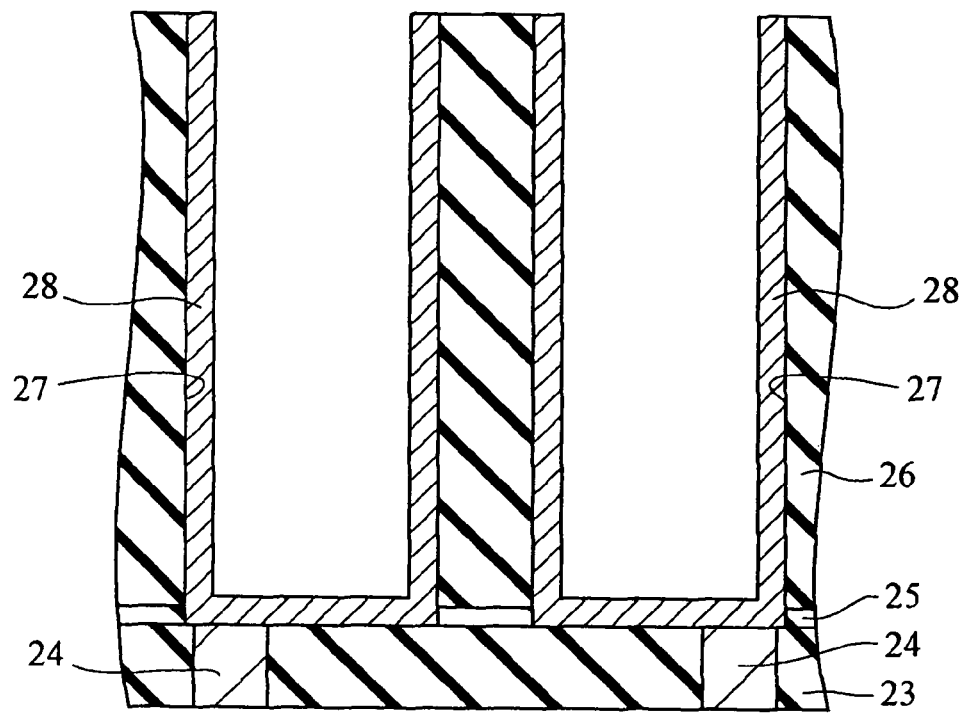
FIGS. 3A and 3B are in-process views of cross-sections near the capacitor of the semiconductor memory device shown in FIG. 1.
Figure 3B:
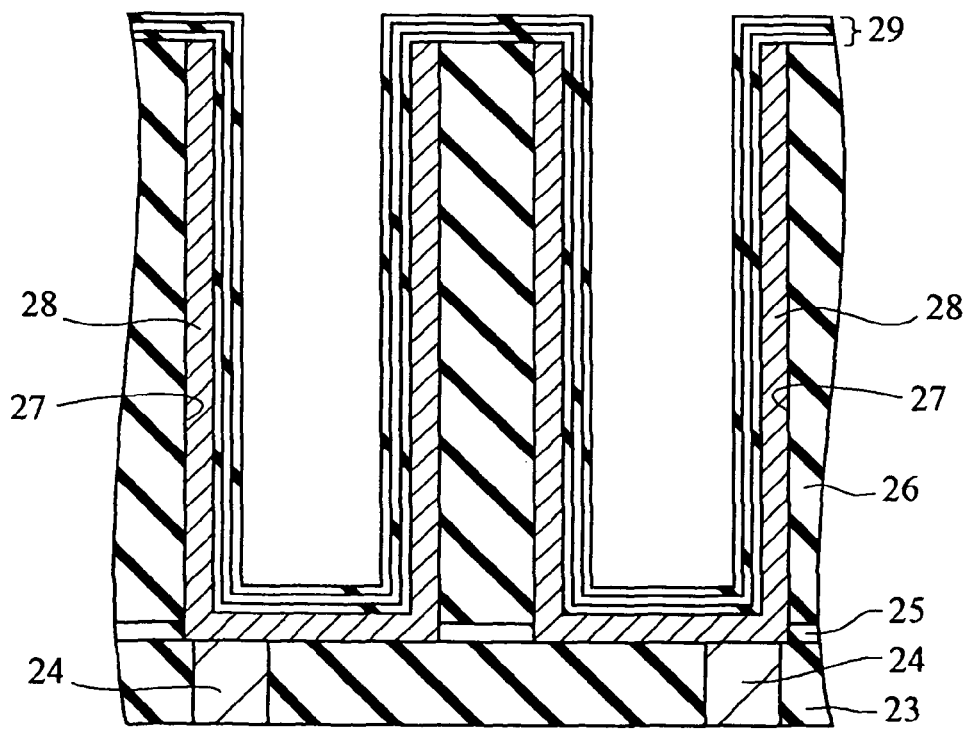

FIGS. 3A and 3B are in-process cross-sectional views of the dielectric film 29. As shown in FIG. 3A, the holes 27 penetrating the second silicon nitride film and the fourth interlayer insulating film 26 are created, thereby exposing the capacitance contact plugs 24 and forming the lower electrodes 28 made of platinum on the inner walls of the holes 27. A barrier layer such as TiN layer may be formed between each capacitance contact plug 24 and each lower electrode 28 in order to prevent formation of $SiO_2$ and to improve adhesiveness. Next, the first titanium oxide film 31a shown in FIG. 2 is formed by film-forming titanium oxide using an atomic layer deposition (ALD) method, so as to cover the lower electrode 28 and the fourth interlayer insulating film 26, as shown in FIG. 3B. Then, the titanium oxide-based dielectric film 32 shown in FIG. 2 is formed by film-forming LTO on the first titanium oxide film 31a by ALD. In addition, the second titanium oxide film 31b shown in FIG. 2 is formed by film-forming titanium oxide on the titanium oxide-based dielectric film 32 by ALD. Next, the upper electrode 30 shown in FIG. 1 is formed by depositing platinum on the second titanium oxide film 31b, so as to fill at least the insides of the holes 27.

Figure 4:
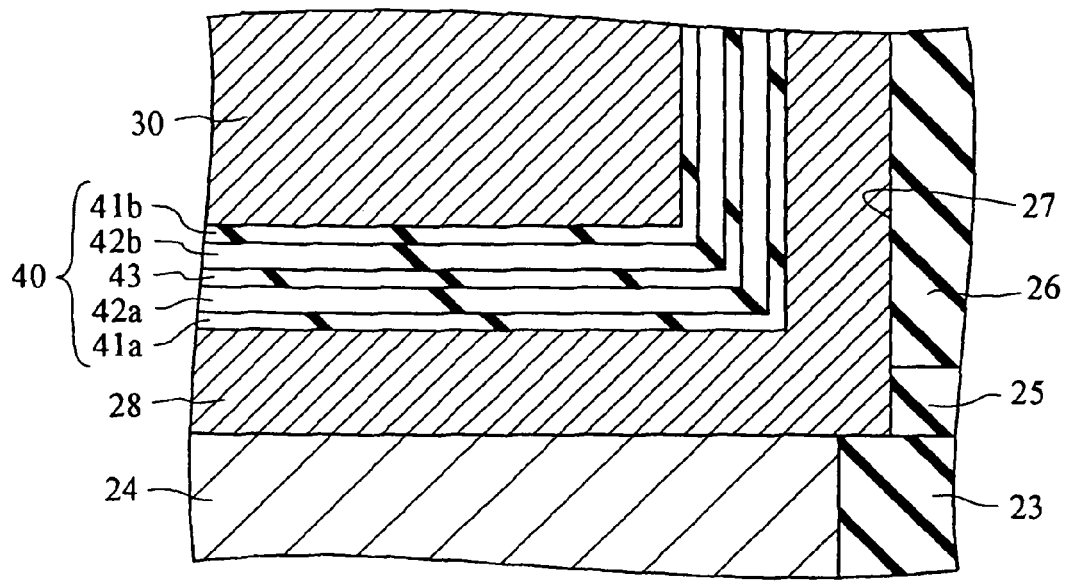
FIG. 4 is a partially enlarged view of a capacitor in accordance with another exemplary embodiment.

Note that in the DRAM of the present exemplary embodiment, a five-layered dielectric film 40 shown in FIG. 4 may be used as a substitute for the three-layered dielectric film 29 shown in FIG. 2. The dielectric film 40 shown in FIG. 4 has a structure in which a first titanium oxide film 41a, a first titanium oxide-based dielectric film 42a, a third titanium oxide film 43, a second titanium oxide-based dielectric film 42b, and a second titanium oxide film 41b are sequentially laminated between the lower electrode 28 and the upper electrode 30. By disposing the third titanium oxide film 43 formed of titanium oxide between the first titanium oxide-based dielectric film 42a and the second titanium oxide-based dielectric film 42b formed of the same titanium oxide-based dielectric material, it is possible to reduce a leakage current. Note that the dielectric films may have an even larger number of layers as long as a titanium oxide film is disposed between the titanium oxide-based dielectric film and the lower electrode and another titanium oxide film is also disposed between the titanium oxide-based dielectric film and the upper electrode.

Figure 5:
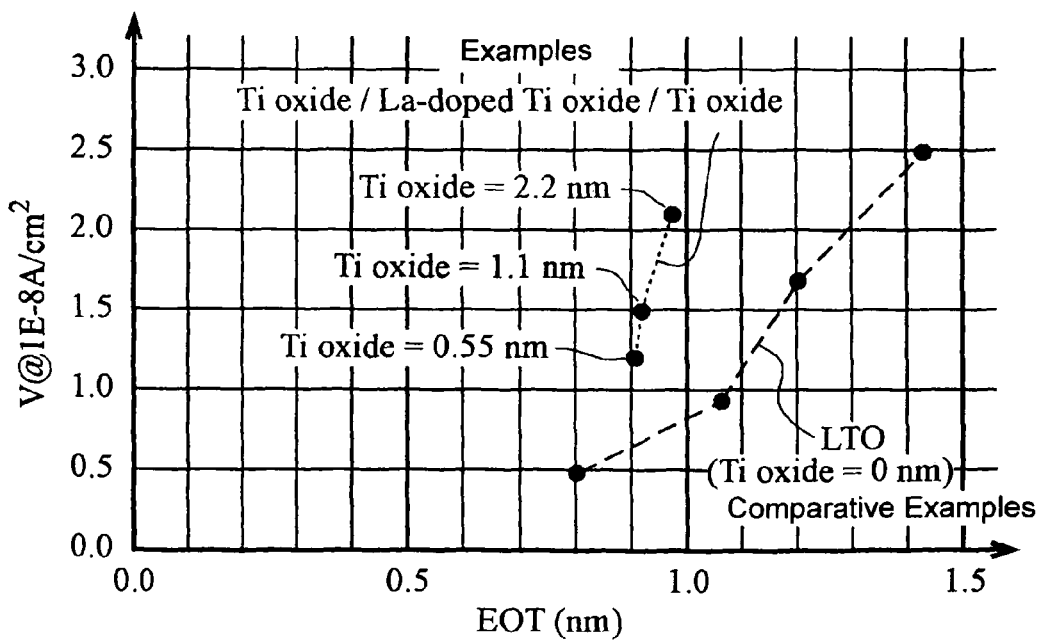
FIG. 5 is a graph showing the relationship between the breakdown voltage and the thickness of a titanium oxide film in the semiconductor memory device shown in FIG. 1, along with the above-described relationship in a comparative example.

FIG. 5 is a graph showing the relationship between the equivalent oxide thickness (EOT) of the dielectric film 29 when the thickness of the first and second titanium oxide films 31a and 31b is varied in the present exemplary embodiment and the applied voltage (breakdown voltage) of the dielectric film 29 at which a leakage current value equals $1\times10^{-8}$ $A/cm^2$. The EOT of only the titanium oxide-based dielectric film 32 of the dielectric film 29 is 0.8 nm. Note that for comparison, FIG. 5 also shows a graph indicating the relationship between the EOT of a dielectric film formed only of LTO and the applied voltage of the dielectric film at which the leakage current value of a capacitor including the dielectric film equals $1\times10^{-8}$ $A/cm^2$. EOT refers to the thickness of a silicon dioxide film having the same electrostatic capacitance value as that of the dielectric film in question. That is, EOT is a value obtained by converting the physical thickness of a dielectric film to an electrical film thickness equivalent to the thickness of an $SiO_2$ film.

As shown in FIG. 5, when the thickness of the first and second titanium oxide films 31a and 31b of the present exemplary embodiment is 0.55 nm, the EOT is approximately 0.90 nm and the breakdown voltage is approximately 1.2 V. When the thickness of the first and second titanium oxide films 31a and 31b is 1.1 nm, the EOT is approximately 0.92 nm and the breakdown voltage is approximately 1.5 V. When the thickness of the first and second titanium oxide films 31a and 31b is 2.2 nm, the EOT is approximately 0.98 nm and the breakdown voltage is approximately 2.1 V.

On the other hand, in the case of the dielectric film formed only of LTO shown in the comparative example, the breakdown voltage when EOT is approximately 0.80 nm is approximately 0.5 V, the breakdown voltage when EOT is approximately 1.07 nm is approximately 0.9 V, the breakdown voltage when EOT is approximately 1.20 nm is approximately 1.7 V, and the breakdown voltage when EOT is approximately 1.43 nm is approximately 2.5 V.

As shown in FIG. 5, the breakdown voltage is higher in the present exemplary embodiment than in the comparative example if the EOT is the same. In addition, when the breakdown voltage is increased from 1.2 V to 2.1 V in the comparative example, the EOT increases by approximately 2.2 nm. In contrast, when the breakdown voltage of the capacitor of the present exemplary embodiment is increased from 1.2 V to 2.1 V, the EOT increases by approximately 0.08 nm. Hence, according to the present exemplary embodiment, it is possible to decrease the amount of EOT change more than ever when increasing the breakdown voltage.

While a description has been made of a DRAM in the present exemplary embodiment, the present invention is applicable to a variety of semiconductor devices provided with a capacitor including a paraelectric film.

While the exemplary embodiments of the present invention have been heretofore described specifically, the present invention is not limited to the above-described exemplary embodiments but may be modified and carried out in various other ways without departing from the subject matter thereof.

What is claimed is:

1. A semiconductor device comprising a capacitor which includes a first electrode, a second electrode, and a dielectric layer disposed between the first electrode and the second electrode, the dielectric layer comprising:

a first paraelectric film formed of a material containing a first metal element and at least one kind of second metal element;

a second paraelectric film disposed between the first electrode and the first paraelectric film; and a third paraelectric film disposed between the second electrode and the first paraelectric film, wherein the second paraelectric film is formed of a material containing the first metal element but not containing the second metal element, the third paraelectric film is formed of a material containing the first metal element but not containing the second metal element, wherein the capacitor comprises a plurality of the first paraelectric films, and a fourth paraelectric film disposed between each pair of the first paraelectric films, the fourth paraelectric film being formed of a material containing the first metal element but not containing the second metal element.

2. The semiconductor device according to claim 1, wherein the first metal element is titanium (Ti).

3. The semiconductor device according to claim 1, wherein the second paraelectric film, the third paraelectric film and the fourth paraelectric film have dielectric constants larger than the dielectric constant of the first paraelectric film.

4. A semiconductor device comprising a capacitor which includes a first electrode, a second electrode, and a dielectric layer disposed between the first electrode and the second electrode, the dielectric layer comprising:
- a first paraelectric film formed of a material containing a first metal element and at least one kind of second metal element;
- a second paraelectric film disposed between the first electrode and the first paraelectric film; and
- a third paraelectric film disposed between the second electrode and the first paraelectric film,
- wherein the second paraelectric film is formed of a material containing the first metal element but not containing the second metal element,
- the third paraelectric film is formed of a material containing the first metal element but not containing the second metal element, and
- wherein the first metal element is titanium (Ti) and the second metal element is selected from the group consisting of hafnium (Hf), aluminum (Al), yttrium (Y) and lanthanum (La).

5. A semiconductor device comprising a capacitor which includes a first electrode, a second electrode and a dielectric layer disposed between the first electrode and the second electrode, the dielectric layer comprising:
- a first paraelectric film formed of a first metal element and at least one kind of second metal element;
- a second paraelectric film disposed between the first electrode and the first paraelectric film; and
- a third paraelectric film disposed between the second electrode and the first paraelectric film,
- wherein the second paraelectric film is formed of a material containing the first metal element but not containing the second metal element,
- the third paraelectric film is formed of a material containing the first metal element but not containing the second metal element, and
- wherein the second paraelectric film and the third paraelectric film have dielectric constants larger than the dielectric constant of the first paraelectric film.

6. The semiconductor device according to claim 5, wherein the first metal element is titanium (Ti).

7. The semiconductor device according to claim 5, wherein the second metal element is selected from the group consisting of hafnium (Hf), aluminum (Al), yttrium (Y) and lanthanum (La).

* * * * *